(12) United States Patent
Lee

(10) Patent No.: US 7,995,406 B2
(45) Date of Patent: Aug. 9, 2011

(54) DATA WRITING APPARATUS AND METHOD FOR SEMICONDUCTOR INTEGRATED CIRCUIT

(75) Inventor: Kang Youl Lee, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 110 days.

(21) Appl. No.: 12/470,012

(22) Filed: May 21, 2009

(65) Prior Publication Data

US 2010/0124129 A1   May 20, 2010

(30) Foreign Application Priority Data

Nov. 18, 2008   (KR) .......................... 10-2008-0114555

(51) Int. Cl.
 *G11C 7/22* (2006.01)

(52) U.S. Cl. ............. 365/189.16; 365/189.02; 365/233.1

(58) Field of Classification Search ............. 365/189.16, 365/189.02, 233.1, 233.11
See application file for complete search history.

(56) References Cited

U.S. PATENT DOCUMENTS

| 6,987,704 | B2 * | 1/2006 | Park | 365/185.17 |
| 2008/0056028 | A1 | 3/2008 | Lee | |
| 2009/0161445 | A1 * | 6/2009 | Lee | 365/189.05 |

FOREIGN PATENT DOCUMENTS

| KR | 1019910006976 | 4/1991 |
| KR | 1020020004860 A | 1/2002 |

* cited by examiner

*Primary Examiner* — Huan Hoang
(74) *Attorney, Agent, or Firm* — IP & T Group LLP

(57) ABSTRACT

A data writing apparatus includes a distributed transmission unit configured to transmit first data and second data, having been aligned to have the same timing, to data lines at mutually different timings, and a data writing unit configured to synchronize the first data and the second data having been transmitted through the data lines and to write the synchronized data in a memory area.

20 Claims, 8 Drawing Sheets

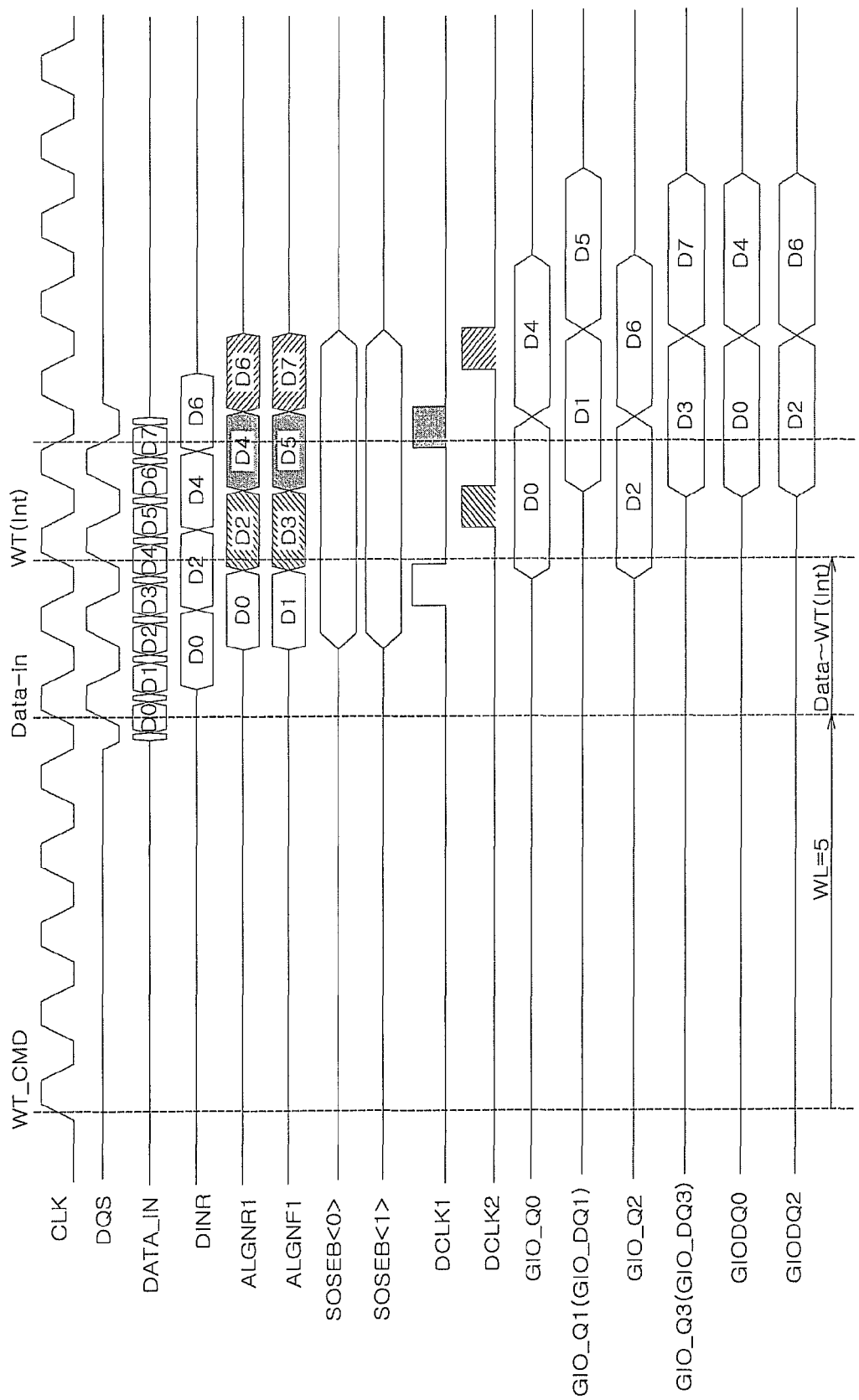

DATA WRITING APPARATUS AND METHOD FOR SEMICONDUCTOR INTEGRATED CIRCUIT

CROSS-REFERENCES TO RELATED PATENT APPLICATION

The present application claims priority under 35 U.S.C. 119(a) to Korean Application No. 10-2008-0114555, filed on Nov. 18, 2008, in the Korean Intellectual Property Office, which is incorporated herein by reference in its entirety as set forth in full.

BACKGROUND OF THE INVENTION

1. Technical Field

The embodiment relates to a semiconductor integrated circuit, and in particular, to a data writing apparatus and method for a semiconductor integrated circuit.

2. Related Art

FIG. 1 is a circuit diagram illustrating a data writing apparatus for a semiconductor integrated circuit according to the related art.

A data writing apparatus for a semiconductor integrated circuit according to the related art is configured to include inverters IV1 and IV2, a buffer 1, first to eleventh flip-flops FF1 to FF11, first to fourth multiplexers 2 to 5, a data clock generator 6, a decoder 7, global data lines GIO0 to GIO3, and a write driver block 8, as shown in FIG. 1.

The first to seventh flip-flops FF1 to FF7 are configured to align data DATA_IN in response to signals DSRP and DSFP, which are in synchronization with a rising edge and a falling edge of a data strobe signal DQS, respectively, so as to generate aligned data ALGNF1, ALGNR1, ALGNF0, and ALGNR0.

The data clock generator 6 is configured to shift a write command WT_CMD by (WL+2)tCK so as to generate a data clock DCLK. Here, "WL" represents write latency and "tCK" represents one cycle time of a clock CLK.

The decoder 7 is configured to decode addresses A0 and A1 so as to generate a decoded signal SOSEB<0:3>. The decoded signal SOSEB<0:3> is commonly input to all of the first to fourth multiplexers 2 to 5.

The first to fourth multiplexers 2 to 5 are configured to each select one of the aligned data ALGNF1, ALGNR1, ALGNF0, and ALGNR0 according to the decoded signal SOSEB<0:3> such that the aligned data selected by the first to fourth multiplexers 2 to 5 are mutually different, and to output the selected data at the same timing. For example, according to the decoded signal SOSEB<0:3>, the first to fourth multiplexers 2 to 5 may sequentially select the aligned data ALGNF1, ALGNR1, ALGNF0, and ALGNR0 or may select the aligned data ALGNR1, ALGNF0, ALGNR0, and ALGNF1.

The eighth to eleventh flip-flops FF8 to FF11 are configured to receive outputs of the first to fourth multiplexers 2 to 5 and then outputs them to the global data lines GIO0 to GIO3 with the same timing in response to the data clock DCLK.

The write driver block 8 is configured to receive data GIO_Q0 to GIO_Q3 transmitted through the global data lines GIO0 to GIO3 and write the data in a memory area.

FIG. 2 is a timing chart illustrating the operation of the data writing apparatus for a semiconductor integrated circuit according to the related art.

The first to seventh flip-flops FF1 to FF7 align data DATA_IN in response to the signals DSRP and DSFP so as to generate the aligned data ALGNF1, ALGNR1, ALGNF0, and ALGNR0.

The aligned data ALGNF1, ALGNR1, ALGNF0, and ALGNR0 are selected by the first to fourth multiplexers 2 to 5 according to the decoded signal SOSEB<0:3> and are output.

The eighth to eleventh flip-flops FF8 to FF11 output the outputs of the first to fourth multiplexers 2 to 5 to the global data lines GIO0 to GIO3 in response to the data clock DCLK.

As described above, the data writing apparatus for a semiconductor integrated circuit according to the related art aligns the data DATA_IN by using the first to seventh flip-flops FF1 to FF7 and then transmits the aligned data to the global data lines GIO0 to GIO3 at the same time in response to the data clock DCLK.

In other words, logic levels of data of all of the global data lines GIO0 to GIO3 are transitioned at the same time.

The related art of FIG. 1 having been described above is configured to include four global data lines GIO0 to GIO3. Actually, in the case of a DDR2, 64 global data lines exist, and in the case of a DDR3, 128 global data lines exist.

As the sizes of semiconductor integrated circuits are reduced, the area ratio occupied by the global data lines to the whole area of semiconductor integrated circuit gradually increase, such that the widths of global data lines are reduced, which results in reducing the intervals between neighboring global data lines.

Therefore if logic levels of data of neighboring global data lines of the global data lines which transmit data at the same time transition to opposite logic levels, they may have negatively influence each other, resulting in distortion and delay in data transmission.

This may also cause errors in data write timings so as not to sufficiently write data in memory cells. As a result, degradation in the refresh capability or an increase in write discovery time tWR may be caused and a serious error such as no data write may also be caused.

SUMMARY OF THE INVENTION

An object of the embodiments is to provide a data writing apparatus and method for a semiconductor integrated circuit capable of preventing distortion and delay in data transmission of global data lines.

According to one embodiment, a data writing apparatus is configured to include a distributed transmission unit configured to transmit first data and second data, having been aligned to have the same timing, to data lines at mutually different timings, and a data writing unit configured to synchronize the first data and the second data having been transmitted through the data lines and to write the synchronized data in a memory area.

According to another embodiment, a data writing apparatus for a semiconductor integrated circuit is configured to include a distributed transmission unit configured to transmit even data and odd data, having been aligned to have the same timing, to data lines at mutually different timings in response to distributed-transmission control signals, a data writing unit configured to synchronize the even data and the odd data, having been transmitted through the data lines, in response to synchronization control signals and to write the synchronized data in a memory area, and a controller configured to generate the distributed-transmission control signals according to a write command and an address signal and to generate the synchronization control signals according to the address signals and the distributed-transmission control signals.

According to still another embodiment a data writing method for a semiconductor integrated circuit is configured to include transmitting first data and second data through data lines at mutually different timings, and synchronizing the first data and the second data having been transmitted through the data lines, and writing the synchronized data in a memory area.

Exemplary embodiments of the present invention can prevent distortion and delay in data transmission by distributed transmission of data. Therefore, data writing capability can be improved, resulting in improved reliability of semiconductor integrated circuits.

Since the embodiments use simpler aligned data ALGNR1 and ALGNF1 as compared to the related art, a configuration of a circuit (including flip-flops FF21 to 23) (see FIG. 4) for aligning data is more simple than the circuit configuration (including the flip-flops FF1 to FF7) for aligning input data according to the related art, and the number of signal lines for transmitting aligned data is also reduced. Therefore, a reduction in a circuit area and easier layout design can also be expected.

These and other features, aspects, and embodiments are described below in the section "Detailed Description."

BRIEF DESCRIPTION OF THE DRAWINGS

Features, aspects, and embodiments are described in conjunction with the attached drawings, in which:

FIG. 8 is a timing chart illustrating the operation of the data writing apparatus for a semiconductor integrated circuit according to the embodiment.

DESCRIPTION OF EXEMPLARY EMBODIMENT

Hereinafter, a data writing apparatus and method according to exemplary embodiments will be described with reference to the accompanying drawings.

Figure 1:
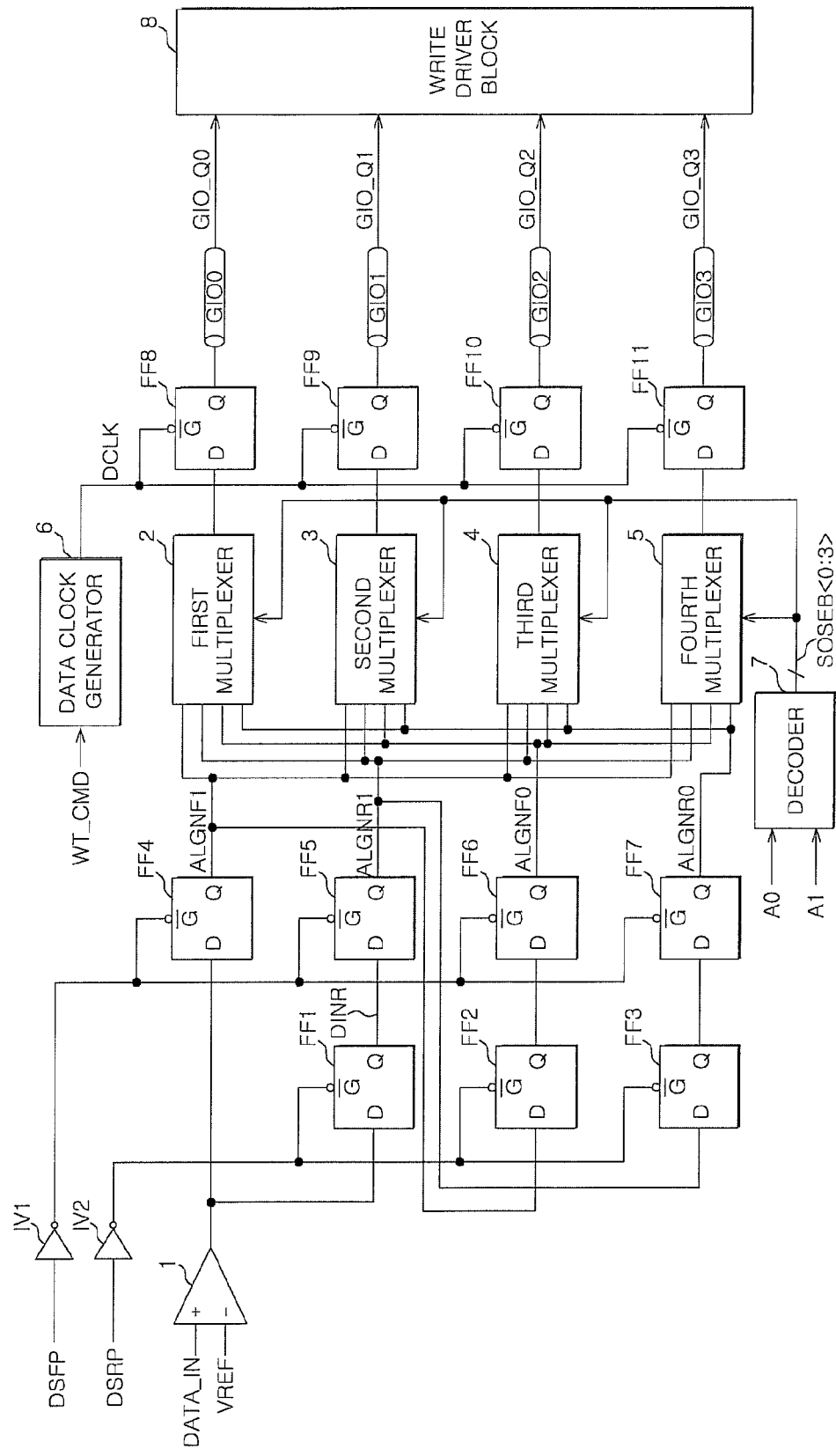
FIG. 1 is a circuit diagram illustrating a data writing apparatus for a semiconductor integrated circuit according to the related art.
Figure 2:
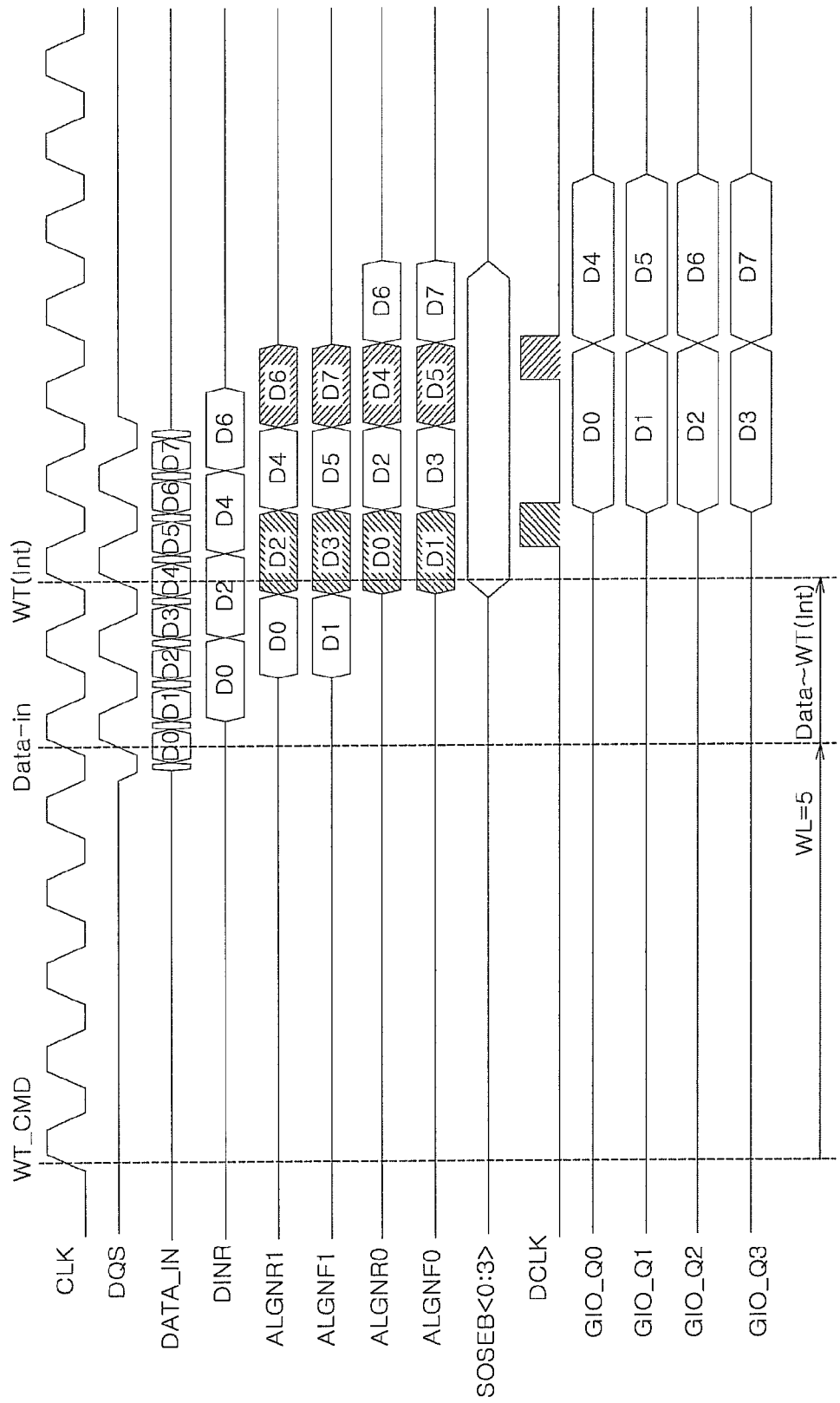
FIG. 2 is a timing chart illustrating the operation of the data writing apparatus for a semiconductor integrated circuit according to the related art.
Figure 3:
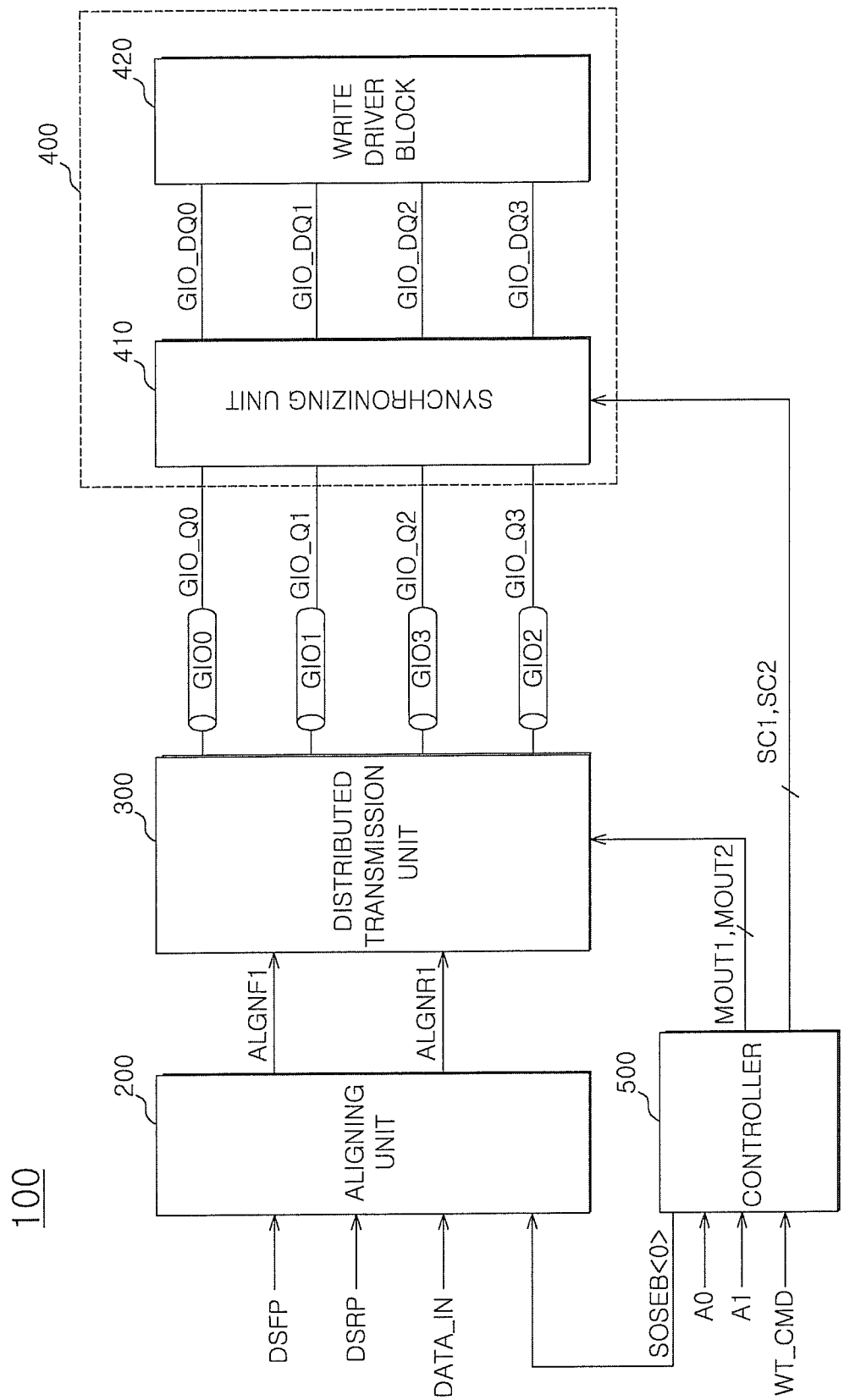
FIG. 3 is a block diagram illustrating a data writing apparatus for a semiconductor integrated circuit according to an embodiment.

FIG. 3 is a block diagram illustrating a data writing apparatus for a semiconductor integrated circuit according to an embodiment.

As shown in FIG. 3, a data writing apparatus 100 for a semiconductor integrated circuit according to an embodiment is configured to include an aligning unit 200, a distributed transmission unit 300, global data lines GIO0 to GIO3, a data writing unit 400, and a controller 500.

The aligning unit 200 is configured to align data DATA_IN in response to an alignment control signal SOSEB<0> and signals DSRP and DSFP, which are each synchronized with a rising edge and a falling edge of a data strobe signal DQS so as to generate aligned data ALGNR1 and ALGNF1.

The distributed transmission unit 300 is configured to perform distributed transmission on the aligned data ALGNR1 and ALGNF1 through the global data lines GIO0 to GIO3 in response to a first distributed-transmission control signal MOUT1 and a second distributed-transmission control signal MOUT2. In other words, it is configured to transmit the aligned data at different timings.

The data writing unit 400 is configured to include a synchronizing unit 410 and a write driver block 420.

The synchronizing unit 410 is configured to synchronize data GIO_Q0 to GIO_Q3, having been transmitted in a distributed manner through the global data lines GIO0 to GIO3, with each other, in response to a first synchronization control signal SC1 and a second synchronization control signal SC2, and to output the synchronized data GIO_DQ0 to GIO_DQ3.

The write driver block 420 is configured to write the synchronized data GIO_DQ0 to GIO_DQ3 in a memory area.

The controller 500 is configured to generate the alignment control signal SOSEB<0>, the first distributed-transmission control signal MOUT1, the second distributed-transmission control signal MOUT2, the first synchronization control signal SC1, and the second synchronization control signal SC2, in response to a write command WT_CMD and addresses A0 and A1.

Figure 4:
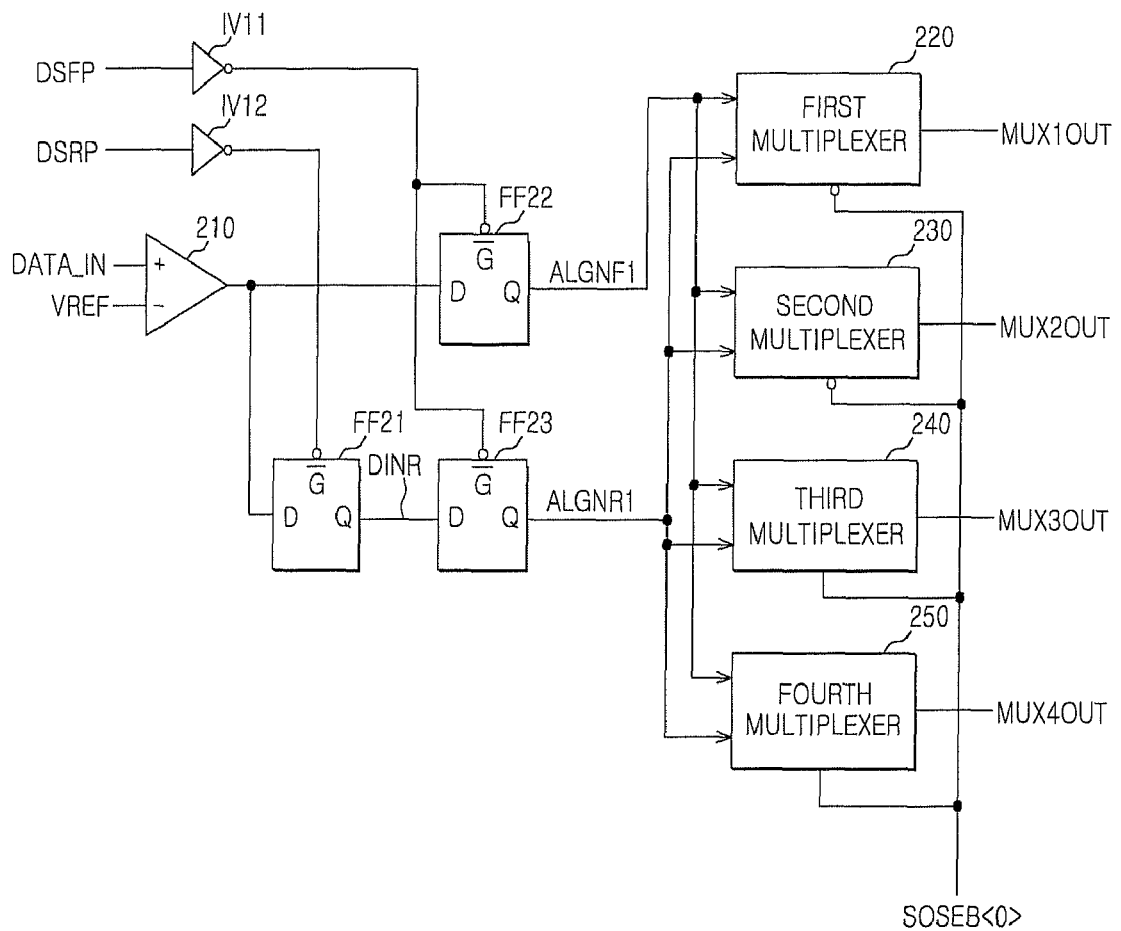
FIG. 4 is a circuit diagram of the aligning unit of FIG. 3.

FIG. 4 is a circuit diagram of the aligning unit of FIG. 3.

The aligning unit 200 is configured to include first and second inverters IV11 and IV12, a buffer 210, first to third flip-flops FF21 to FF23, and first to fourth multiplexers 220 to 250, as shown FIG. 4.

The first flip-flop FF21 is configured to receive data output from the buffer 210 and to output data DINR in response to the signal DSRP. The second flip-flop FF22 is configured to receive the data output from the buffer 210 and to output the odd aligned data ALGNF1 in response to the signal DSFP. The third flip-flop FF23 is configured to receive the data DINR output from the first flip-flop FF21 and to output the even aligned data ALGNR1 in response to the signal DSFP.

The first to fourth multiplexers 220 to 250 are each configured to receive the even aligned data ALGNR1 and the odd aligned data ALGNF1 in common, to select one of them according to the alignment control signal SOSEB<0>, and to output the selected data.

Figure 5:
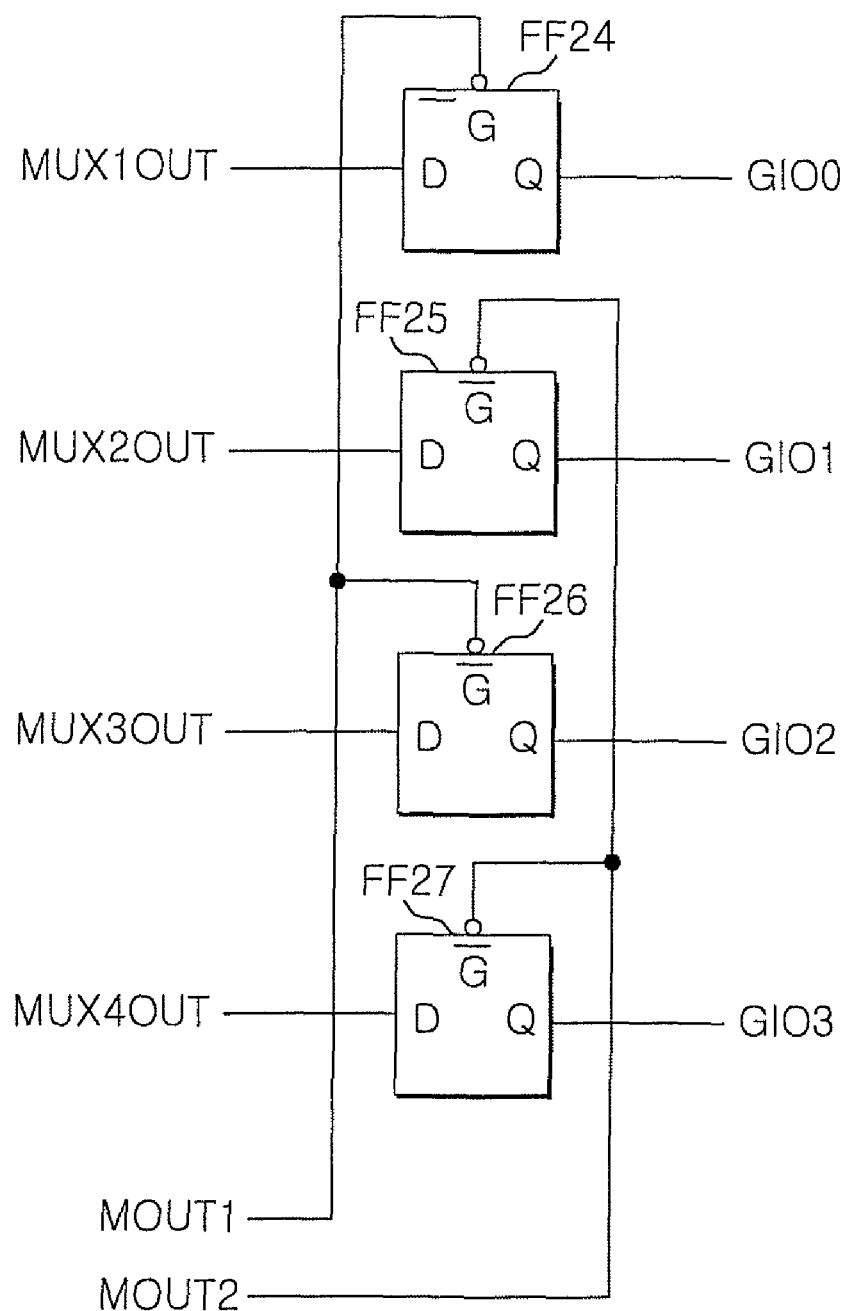
FIG. 5 is a circuit diagram of the distributed transmission unit of FIG. 3.

FIG. 5 is a circuit diagram of the distributed transmission unit of FIG. 3.

The distributed transmission unit 300 is configured to include fourth to seventh flip-flops FF24 to FF27, as shown in FIG. 5.

The fourth flip-flop FF24 and the sixth flip-flop FF26 are configured to transmit output signals MUX1OUT and MUX3OUT of the first multiplexer 220 and the third multiplexer 240 to the global data lines GIO0 and GIO2, respectively, in response to the first distributed-transmission control signal MOUT1.

The fifth flip-flop FF25 and the seventh flip-flop FF27 are configured to transmit output signals MUX2OUT and MUX4OUT of the second multiplexer 230 and the fourth multiplexer 250 to the global data lines GIO1 and GIO3, respectively, in response to the second distributed-transmission control signal MOUT2.

Figure 6:
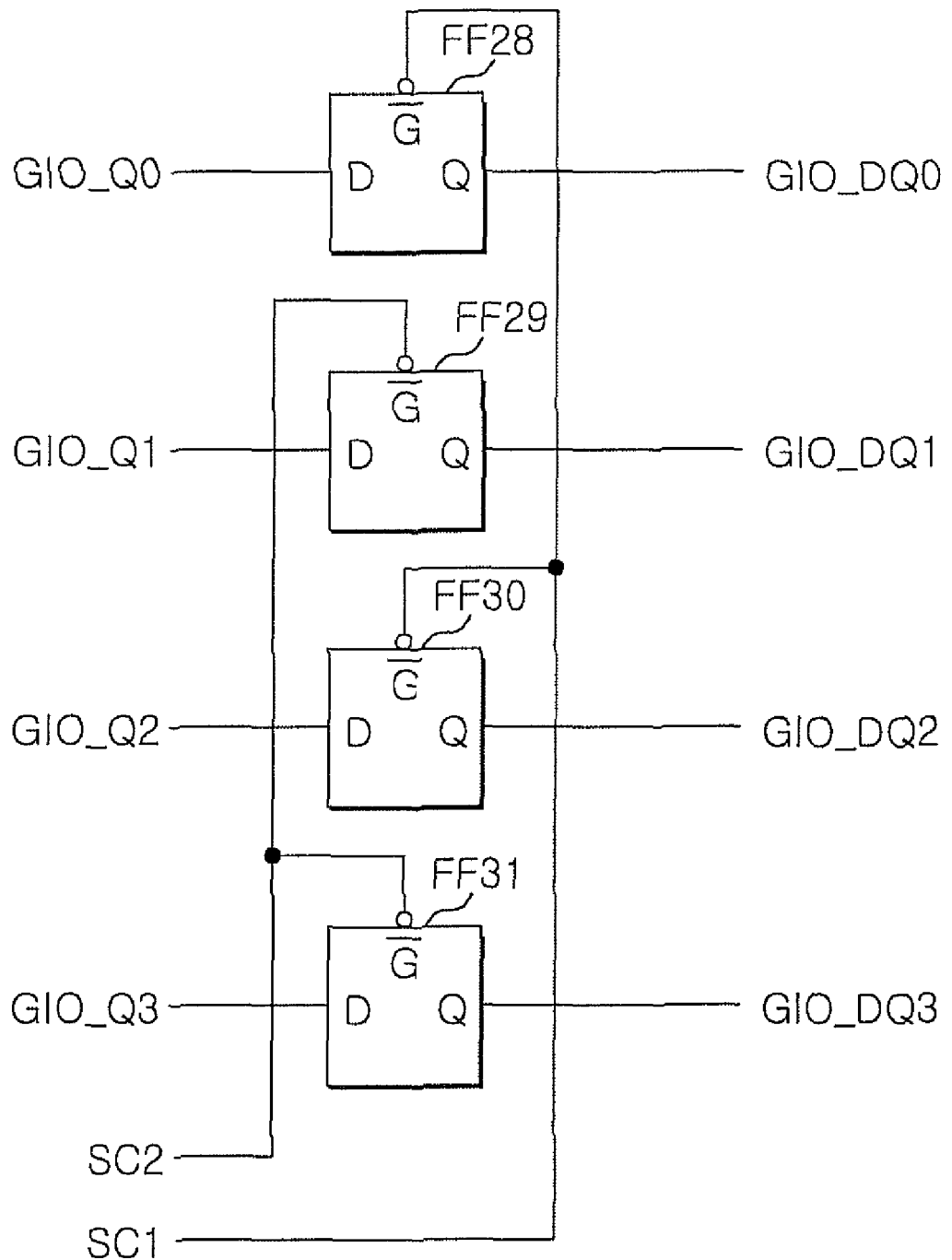
FIG. 6 is a circuit diagram of the synchronizing unit of FIG. 3.

FIG. 6 is a circuit diagram of the synchronizing unit of FIG. 3.

The synchronizing unit 410 is configured to include eighth to eleventh flip-flops FF28 to FF31, as shown in FIG. 6.

The eighth flip-flop FF28 and the tenth flip-flop FF30 are configured to output the data GIO_DQ0 to GIO_DQ2 transmitted through the global data lines GIO0 and GIO2 as even synchronized data GIO_DQ0 and GIO_DQ2 in response to the first synchronization control signal SC1.

The ninth flip-flop FF29 and the eleventh flip-flop FF31 are configured to output the data GIO_DQ1 and GIO_DQ3 transmitted through the global data lines GIO1 and GIO3 as odd synchronized data GIO_DQ1 and GIO_DQ3 in response to the second synchronization control signal SC2.

Figure 7:
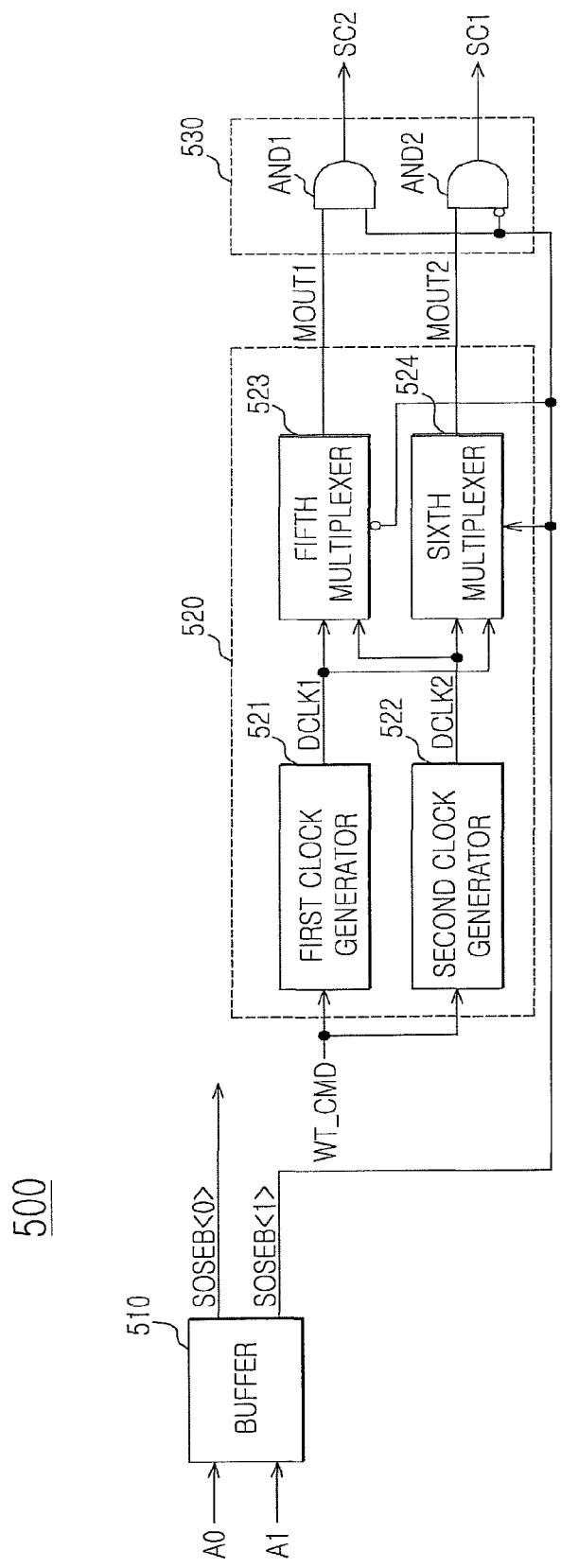
FIG. 7 is a circuit diagram of the controller of FIG. 3.

FIG. 7 is a circuit diagram of the controller of FIG. 3.

The controller 500 is configured to include a buffer 510, a distributed-transmission control-signal generator 520, and a synchronization control-signal generator 530, as shown in FIG. 7.

The buffer 510 is configured to buffer the address A0 and the address A1 and to output them as the alignment control signal SOSEB<0> and a selection control signal SOSEB<1>, respectively. The alignment control signal SOSEB<0> is the buffered address A0 and has the same logic value as the address A0, and the selection control signal SOSEB<1> is the buffered address A1 and has the same logic value as the address A1. Therefore, the addresses A0 and A1 may be directly used instead of the alignment control signal SOSEB<0> and the selection control signal SOSEB<1>.

The distributed-transmission control-signal generator 520 is configured to include a first clock generator 521, a second clock generator 522, a fifth multiplexer 523, and a sixth multiplexer 524.

The first clock generator 521 is configured to shift the write command WT_CMD by (WL+1)tCK so as to generate a first data clock DCLK1. Here, "WL" represents a write latency and "tCK" represents one cycle time of a clock CLK.

The second clock generator 522 is configured to shift the write command WT_CMD by (WL+2)tCK so as to generate a second data clock DCLK2.

The fifth multiplexer 523 is configured to select any one of the first data clock DCLK1 and the second data clock DCLK2 according to the inverted signal of the selection control signal SOSEB<1> and output the selected clock as the first distributed-transmission control signal MOUT1.

The sixth multiplexer 524 is configured to select any one of the first data clock DCLK1 and the second data clock DCLK2 according to the selection control signal SOSEB<1> and outputs the selected clock as the second distributed-transmission control signal MOUT2.

If the selection control signal SOSEB<1> is at a logic low level, the fifth multiplexer 523 selects the first data clock DCLK1 as the first distributed-transmission control signal MOUT1, and the sixth multiplexer 524 selects the second data clock DCLK2 as the second distributed-transmission control signal MOUT2. If the selection control signal SOSEB<1> is at a logic high level, the fifth multiplexer 523 selects the second data clock DCLK2 as the first distributed-transmission control signal MOUT1, and the sixth multiplexer 524 selects the first data clock DCLK1 as the second distributed-transmission control signal MOUT2.

The synchronization control signal generator 530 is configured to include a first AND gate AND1 and a second AND gate AND2.

The first AND gate AND1 is configured to perform logical product on the first distributed-transmission control signal MOUT1 and the selection control signal SOSEB<1> so as to generate the second synchronization control signal SC2.

The second AND gate AND2 is configured to perform logical product on the second distributed-transmission control signal MOUT2 and an inverted signal of the selection control signal SOSEB<1> so as to generate the first synchronization control signal SC1.

If the selection control signal SOSEB<1> is at the logic low level, the first AND gate AND1 outputs the second synchronization control signal SC2 having a logic low level, regardless of the first distributed-transmission control signal MOUT1, and the second AND gate AND2 outputs the second distributed-transmission control signal MOUT2 as the first synchronization control signal SC1. If the selection control signal SOSEB<1> is at the logic high level, the first AND gate AND1 outputs the first distributed-transmission control signal MOUT1 as the second synchronization control signal SC2, and the second AND gate AND2 outputs the first synchronization control signal SC1 having a logic low level, regardless of the second distributed-transmission control signal MOUT2.

FIG. 8 is a timing chart illustrating the operation of the data writing apparatus for a semiconductor integrated circuit according to the embodiment.

The operation of the embodiment having the above-mentioned configuration will be described below.

The first flip-flop FF21 of FIG. 4 receives the data DATA_IN input through DQ pins and synchronizes the data in response to the signal DSRP to generate data DINR (data D0).

The third flip-flop FF23 and the second flip-flop FF22 synchronize the data DINR (for example, D0, D2, D4, or D6) and subsequent data (for example D1, D3, D5, or D7) to the data DINR in response to the signal DSFP, so as to generate even aligned data ALGNR1 and odd aligned data ALGNF1.

In this case, assuming that the address A1, that is, the selection control signal SOSEB<1> is at the logic low level, the fifth multiplexer 523 of FIG. 7 selects the first data clock DCLK1 as the first distributed-transmission control signal MOUT1, and the sixth multiplexer 524 selects the second data clock DCLK2 as the second distributed-transmission control signal MOUT2.

Therefore, the fourth and sixth flip-flops FF24 and FF26 of FIG. 5 output the even aligned data ALGNR1 to the global data lines GIO0 and GIO2 at a timing of (WL+1)tCK according to the first data clock DCLK1. Meanwhile, the fifth and seventh flip-flops FF25 and FF27 output the odd aligned data ALGNF1 to the global data lines GIO1 and GIO3 at a timing which is delayed by one cycle of the clock (CLK) than the even aligned data ALGNR1, that is, a timing of (WL+2)tCK according to the second data clock DCLK2. In other words, distributed transmission of the even aligned data ALGNR1 and the odd aligned data ALGNF1 is performed.

The above-mentioned operation is performed on the assumption that the address A1, that is, the selection control signal SOSEB<1> is at the logic low level. To the contrary, if the selection control signal SOSEB<1> is at the logic high level, the even aligned data ALGNR1 is output through the global data lines GIO0 and GIO3 at a timing which is later than the odd aligned data ALGNF1 by one cycle of the clock CLK.

In the case in which the address A1, that is, the selection control signal SOSEB<1> is at the logic low level, the first AND gate AND1 of FIG. 7 outputs the second synchronization control signal SC2 having a logic low level, and the second AND gate AND2 outputs the second distributed-transmission control signal MOUT2, that is, the second data clock DCLK2 as the first synchronization control signal SC1.

Therefore, the eighth and tenth flip-flops FF28 and FF30 of FIG. 6 synchronize the even aligned data ALGNR1 transmitted through the global data lines GIO0 and GIO2 with the first synchronization control signal SC1, that is, the second data clock DCLK2, and output the even synchronized data GIO_DQ0 and GIO_DQ2.

In this case, the transmission of the even aligned data ALGNR1 through the global data lines GIO0 and GIO2 is performed in synchronization with the first distributed-transmission control signal MOUT1, that is, the first data clock DCLK1. However, a time point where the even aligned data ALGNR1 is output through the eighth and tenth flip-flops FF28 and FF30 is a time point which is in synchronization with the second data clock DCLK2, that is, a time point which is delayed by one cycle of the clock CLK.

Meanwhile, since the second synchronization control signal SC2 is maintained at a logic low level, the ninth and eleventh flip-flops FF29 and FF31 output the odd aligned data ALGNF1, having been transmitted through the global data lines GIO1 and GIO3, as the odd synchronized data GIO_DQ1 and GIO_DQ3 without delay.

The even synchronized data GIO_DQ0 and GIO_DQ2 and the odd synchronized data GIO_DQ1 and GIO_DQ3 are input to the write driver block 420 of FIG. 3 at the same time point and are written in the memory area.

Consequently, the embodiment is configured to perform distributed transmission of data to global data lines and to synchronize the data having been transmitted in a distributed manner in a circuit configuration for writing data.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A data writing apparatus for a semiconductor integrated circuit comprising:
    a distributed transmission unit configured to receive first data and second data in parallel at the same time and transmit the first and second data received at the same time to data lines at different times, respectively; and
    a data writing unit configured to receive the transmitted first and second data, synchronize the transmitted first data and the transmitted second data and write the synchronized data in a memory area.

2. The data writing apparatus of claim 1, wherein the data lines include global I/O lines.

3. The data writing apparatus of claim 2, further comprising:
    an aligning unit configured to align sequential input data in response to a data strobe signal and to output the first data and the second data to the distributed transmission unit.

4. The data writing apparatus of claim 3, wherein the distributed transmission unit is configured to transmit the first data and the second data to the data lines at mutually different timings according to a first data clock and a second data clock.

5. The data writing apparatus of claim 3, wherein the data writing unit is configured to delay the earlier transmitted one of the first data and the second data by a predetermined time so as to synchronize the first data and the second data with each other.

6. The data writing apparatus of claim 5, wherein the data writing unit is configured to delay the earlier transmitted one of the first data and the second data by the predetermined time according to a combination of a first data clock and a second data clock and an address signal.

7. The data writing apparatus of claim 6, wherein the first data clock and the second data clock are generated in response to a write command and the generation cycles thereof are set to be different from each other.

8. A data writing apparatus for a semiconductor integrated circuit, comprising:
    a distributed transmission unit configured to transmit even data and odd data, having been aligned to have the same timing, to data lines at mutually different timings in response to distributed-transmission control signals;
    a data writing unit configured to synchronize the even data and the odd data, having been transmitted through the data lines, in response to synchronization control signals and to write the synchronized data in a memory area; and
    a controller configured to generate the distributed-transmission control signals according to a write command and an address signal and to generate the synchronization control signals according to the address signal and the distributed-transmission control signals.

9. The data writing apparatus of claim 8, wherein the data lines include global I/O lines.

10. The data writing apparatus of claim 9, further comprising:
    an aligning unit configured to align sequential input data in response to a data strobe signal and to output the even data and the odd data to the distributed transmission unit.

11. The data writing apparatus of claim 10, wherein
    the distributed-transmission control signals include a first distributed-transmission control signal and a second distributed-transmission control signal, and
    the distributed transmission unit includes
        a first flip-flop configured to output the even data in response to the first distributed-transmission control signal, and
        a second flip-flop configured to output the odd data in response to the second distributed-transmission control signal.

12. The data writing apparatus of claim 10, wherein
    the data writing unit includes
        a synchronizing unit configured to synchronize the even data and the odd data with each other in response to synchronization control signals, and
        a write driver block configured to write the even data and the odd data, having been synchronized with each other, in the memory area.

13. The data writing apparatus of claim 12, wherein
    the synchronization control signals include a first synchronization control signal and a second synchronization control signal, and
    the synchronizing unit includes
        a first flip-flop configured to output the even data in response to the first synchronization control signal, and
        a second flip-flop configured to output the odd data in response to the second synchronization control signal.

14. The data writing apparatus of claim 10, wherein
    the controller includes
        a distributed-transmission control-signal generator configured to generate a first data clock and a second clock having mutually different timings in response to the write command and to generate the distributed-transmission control signals by use of the first data clock, the second data clock, and the address signal, and a synchronization control-signal generator configured to generate the synchronization control signals by use of the distributed-transmission control signals and the address signal.

15. The data writing apparatus of claim 14, wherein
the distributed-transmission control signals include a first distributed-transmission control signal and a second distributed-transmission control signal, and
the distributed-transmission control-signal generator includes
 a first clock generator configured to generate the first data clock in response to the write command,
 a second clock generator configured to generate the second data clock in response to the write command,
 a first multiplexer configured to output one of the first data clock and the second data clock as the first distributed-transmission control signal according to an inverted signal of the address signal, and
 a second multiplexer configured to output the other of the first data clock and the second data clock as the second distributed-transmission control signal according to the address signal.

16. The data writing apparatus of claim 15, wherein
the synchronization control signals include a first synchronization control signal and a second synchronization control signal, and
the synchronization control signal generator includes
 a first logic device configured to combine the address signal and the first distributed-transmission control signal to generate the second synchronization control signal, and
 a second logic device configured to combine the inverted signal of the address signal and the second distributed-transmission control signal to generate the first synchronization control signal.

17. The data writing apparatus of claim 16, wherein the first clock generator and the second clock generator are configured to generate the first data clock and the second data clock with a predetermined time difference.

18. A data writing method for a semiconductor integrated circuit, comprising:
 receiving first data and second data in parallel at the same time;
 transmitting the first data and second data received at the same time through data lines at different times, respectively; and
 receiving the transmitted first and second data, synchronizing the transmitted first data and the transmitted second data, and writing the synchronized data in a memory area.

19. The data writing method of claim 18, wherein the transmitting of the first data and the second data received at the same time is performed by determining timings of the transmission of the first data and the transmission of the second data through the data lines according to a first data clock and a second data clock having mutually different timings.

20. The data writing method of claim 19, wherein the synchronizing of the transmitted first data and the transmitted second data is performed by delaying the earlier transmitted one of either the transmitted first data and the transmitted second data by a predetermined time.

* * * * *